(12) United States Patent
Yamamoto

(10) Patent No.: US 11,507,338 B2
(45) Date of Patent: Nov. 22, 2022

(54) SYSTEM AND METHOD FOR PROVIDING A DYNAMIC AUDIO ENVIRONMENT WITHIN A VEHICLE

(71) Applicant: Honda Motor Co., Ltd., Tokyo (JP)

(72) Inventor: Stuart Masakazu Yamamoto, La Mirada, CA (US)

(73) Assignee: HONDA MOTOR CO., LTD., Tokyo (JP)

( * ) Notice: Subject to any disclaimer, the term of this patent is extended or adjusted under 35 U.S.C. 154(b) by 129 days.

(21) Appl. No.: 16/931,789

(22) Filed: Jul. 17, 2020

(65) Prior Publication Data
US 2021/0208839 A1 Jul. 8, 2021

Related U.S. Application Data

(60) Provisional application No. 62/958,559, filed on Jan. 8, 2020.

(51) Int. Cl.
| | | |
|---|---|---|
| H04B 1/00 | (2006.01) | |
| G06F 3/16 | (2006.01) | |
| G10L 25/51 | (2013.01) | |
| H04R 3/00 | (2006.01) | |
| G10K 11/00 | (2006.01) | |
| G10K 15/08 | (2006.01) | |

(52) U.S. Cl.
CPC ............ *G06F 3/165* (2013.01); *G10K 11/002* (2013.01); *G10K 15/08* (2013.01); *G10L 25/51* (2013.01); *H04R 3/00* (2013.01); *H04R 2499/13* (2013.01)

(58) Field of Classification Search
CPC .......................... H04R 2499/13; G06F 3/165
USPC ........................................................ 381/86
See application file for complete search history.

(56) References Cited

U.S. PATENT DOCUMENTS

2009/0028353 A1* 1/2009 Kobayashi ............. A63G 31/16
  381/61
2019/0165750 A1* 5/2019 Goldman-Shenhar ......................
  H03G 7/007

* cited by examiner

*Primary Examiner* — Katherine A Faley
(74) *Attorney, Agent, or Firm* — Rankin, Hill & Clark LLP

(57) ABSTRACT

A system and method for providing a dynamic audio environment within a vehicle that includes receiving data associated with at least one audio stream that is being played through an audio system of the vehicle. The system and method also include determining a selected vehicle mode of the vehicle. The system and method additionally include selecting at least one audio effect that is associated with the selected vehicle mode of the vehicle to alter the at least one audio stream. The system and method further include controlling at least one audio source of the vehicle to provide the at least one audio stream according to the at least one audio effect.

13 Claims, 5 Drawing Sheets and drawings with the same numerals, respectively. The drawing figures are not necessarily drawn to scale and certain figures can be shown in exaggerated or generalized form in the interest of clarity and conciseness. The disclosure itself, however, as well as a preferred mode of use, further objects and advances thereof, can be best understood by reference to the following detailed description of illustrative embodiments when read in conjunction with the accompanying drawings, wherein:
SYSTEM AND METHOD FOR PROVIDING A DYNAMIC AUDIO ENVIRONMENT WITHIN A VEHICLE

CROSS-REFERENCE TO RELATED APPLICATION

This application claims priority to U.S. Provisional Application Ser. No. 62/958,559 filed on Jan. 8, 2020, which is expressly incorporated herein by reference.

BACKGROUND

Currently vehicle audio systems provide static and unchanging sound effects regardless of external factors. In some cases, a volume of sound may increase or decrease based on a speed of the vehicle. However, there has been very little advancement in enhancing various sound effects that may provide a dynamic high quality audio experience within an interior cabin of a vehicle. Also, in some circumstances, external sources of audio provided within the vehicle based on operation of the vehicle and/or external noise (e.g., road noise) may distort or diminish the quality of a passenger's listening experience within the vehicle.

BRIEF DESCRIPTION

According to one aspect, a computer-implemented method for providing a dynamic audio environment within a vehicle that includes receiving data associated with at least one audio stream that is being played through an audio system of the vehicle. The computer-implemented method also includes determining a selected vehicle mode of the vehicle. The selected vehicle mode impacts at least one of: a mechanical operation, an electrical operation, or a dynamic operation of the vehicle. The computer-implemented method additionally includes implementing at least one audio effect that is associated with the selected vehicle mode of the vehicle to alter the at least one audio stream. The computer-implemented method further includes controlling at least one audio source of the vehicle to provide the at least one audio stream according to the at least one audio effect.

According to another aspect, a system for providing a dynamic audio environment within a vehicle that includes a memory storing instructions when executed by a processor cause the processor to receive data associated with at least one audio stream that is being played through an audio system of the vehicle. The instructions also cause the processor to determine a selected vehicle mode of the vehicle. The selected vehicle mode impacts at least one of: a mechanical operation, an electrical operation, or a dynamic operation of the vehicle. The instructions additionally cause the processor to implement at least one audio effect that is associated with the selected vehicle mode of the vehicle to alter the at least one audio stream. The instructions further cause the processor to control at least one audio source of the vehicle to provide the at least one audio stream according to the at least one audio effect.

According to yet another aspect, a non-transitory computer readable storage medium storing instructions that when executed by a computer, which includes a processor perform a method that includes receiving data associated with at least one audio stream that is being played through an audio system of a vehicle. The method also includes determining a selected vehicle mode of the vehicle. The selected vehicle mode impacts at least one of: a mechanical operation, an electrical operation, or a dynamic operation of the vehicle. The method additionally includes implementing at least one audio effect that is associated with the selected vehicle mode of the vehicle to alter the at least one audio stream. The method further includes controlling at least one audio source of the vehicle to provide the at least one audio stream according to the at least one audio effect.

BRIEF DESCRIPTION OF THE DRAWINGS

The novel features believed to be characteristic of the disclosure are set forth in the appended claims. In the descriptions that follow, like parts are marked throughout the specification and drawings with the same numerals, respectively. The drawing figures are not necessarily drawn to scale and certain figures can be shown in exaggerated or generalized form in the interest of clarity and conciseness. The disclosure itself, however, as well as a preferred mode of use, further objects and advances thereof, can be best understood by reference to the following detailed description of illustrative embodiments when read in conjunction with the accompanying drawings, wherein:

DETAILED DESCRIPTION

Figure 1:
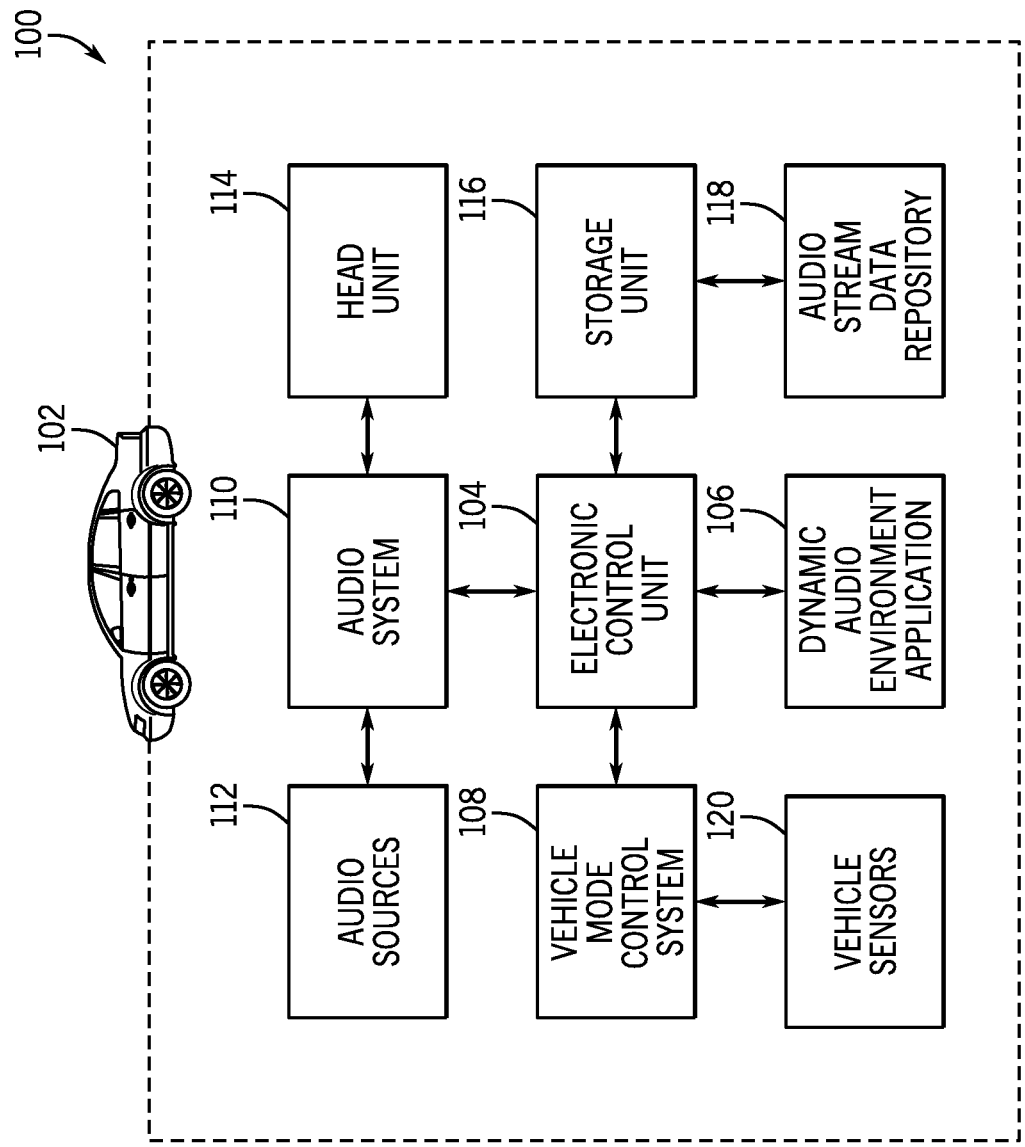
FIG. 1 is a schematic view of an exemplary operating environment of a system for providing a dynamic audio environment within a vehicle according to an exemplary embodiment of the present disclosure.

The following includes definitions of selected terms employed herein. The definitions include various examples and/or forms of components that fall within the scope of a term and that can be used for implementation. The examples are not intended to be limiting.

A "bus," as used herein, refers to an interconnected architecture that is operably connected to transfer data between computer components within a singular or multiple systems. The bus can be a memory bus, a memory controller, a peripheral bus, an external bus, a crossbar switch, and/or a local bus, among others. The bus can also be a vehicle bus that interconnects components inside a vehicle using protocols such as Controller Area network (CAN), Local Interconnect Network (LIN), among others.

"Computer communication", as used herein, refers to a communication between two or more computing devices (e.g., computer, personal digital assistant, cellular telephone, network device) and can be, for example, a network transfer, a file transfer, an applet transfer, an email, a hypertext transfer protocol (HTTP) transfer, and so on. A computer communication can occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, among others.

An "input device" as used herein can include devices for controlling different vehicle features which are include various vehicle components, systems, and subsystems. The term "input device" includes, but it not limited to: push buttons, rotary knobs, and the like. The term "input device" additionally includes graphical input controls that take place within a user interface which can be displayed by various types of mechanisms such as software and hardware based controls, interfaces, or plug and play devices.

A "memory," as used herein can include volatile memory and/or nonvolatile memory. Non-volatile memory can include, for example, ROM (read only memory), PROM (programmable read only memory), EPROM (erasable PROM) and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDR SDRAM), and direct RAM bus RAM (DR-RAM).

A "module", as used herein, includes, but is not limited to, hardware, firmware, software in execution on a machine, and/or combinations of each to perform a function(s) or an action(s), and/or to cause a function or action from another module, method, and/or system. A module can include a software controlled microprocessor, a discrete logic circuit, an analog circuit, a digital circuit, a programmed logic device, a memory device containing executing instructions, and so on.

An "operable connection," as used herein can include a connection by which entities are "operably connected", is one in which signals, physical communications, and/or logical communications can be sent and/or received. An operable connection can include a physical interface, a data interface and/or an electrical interface.

An "output device" as used herein can include devices that can derive from vehicle components, systems, subsystems, and electronic devices. The term "output devices" includes, but is not limited to: display devices, and other devices for outputting information and functions.

A "processor", as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures. The processor can include various modules to execute various functions.

A "vehicle", as used herein, refers to any moving vehicle that is capable of carrying one or more human occupants and is powered by any form of energy. The term "vehicle" includes, but is not limited to: cars, trucks, vans, minivans, SUVs, motorcycles, scooters, boats, personal watercraft, and aircraft. In some cases, a motor vehicle includes one or more engines.

A "vehicle system", as used herein can include, but are not limited to, any automatic or manual systems that can be used to enhance the vehicle, driving and/or safety. Exemplary vehicle systems include, but are not limited to: an electronic stability control system, an anti-lock brake system, a brake assist system, an automatic brake prefill system, a low speed follow system, a cruise control system, a collision warning system, a collision mitigation braking system, an auto cruise control system, a lane departure warning system, a blind spot indicator system, a lane keep assist system, a navigation system, a transmission system, brake pedal systems, an electronic power steering system, visual devices (e.g., camera systems, proximity sensor systems), a climate control system, an electronic pretensioning system, among others.

I. System Overview

Referring now to the drawings, wherein the showings are for purposes of illustrating one or more exemplary embodiments and not for purposes of limiting the same, FIG. 1 is a schematic view of an exemplary operating environment of a system 100 for providing a dynamic audio environment within a vehicle 102 according to an exemplary embodiment of the present disclosure. The components of the system 100, as well as the components of other systems, hardware architectures and software architectures discussed herein, may be combined, omitted or organized into different architecture for various embodiments. However, the exemplary embodiments discussed herein focus on the system 100 as illustrated in FIG. 1, with corresponding system components, and related methods.

As shown in the illustrated embodiment of FIG. 1, the vehicle 102 may include an electronic control unit (ECU) 104 that may be include a memory (not shown) that is configured to store instructions when executed by the ECU 104 that cause the ECU 104 to execute a dynamic audio environment application (dynamic audio application) 106. As discussed below, the dynamic audio application 106 may be configured to receive data associated with one or more audio streams that are played back through an audio system 110 of the vehicle 102 through one or more audio sources 112 of the vehicle 102. The one or more audio sources 112 may include various types of speakers that may be located at various portions of an interior cabin of the vehicle 102 (illustrated in an example of FIG. 2).

The one or more audio streams may include one or more types of audio that may be provided through various formats including, but not limited to, music (e.g., one or more genres of music), speech (e.g., radio talk show), live events (e.g., sporting events), and the like. The one or more audio streams may be based on various digital audio file system configurations that may include, but may not be limited to, waveform audio, uncompressed audio, compressed audio, and the like. Additionally, the one or more audio streams may be provided based on the execution of one or more digital audio files, the playback of a physical audio medium (e.g., compact-disc), the reception of radio waves and/or satellite based signals (e.g., AM radio, FM radio, satellite radio), and the like.

In an exemplary embodiment, the dynamic audio application 106 maybe configured to determine a vehicle mode of the vehicle 102 based on data that may be communicated by a vehicle mode control system 108 of the vehicle 102. The vehicle mode control system 108 may be configured to select a particular vehicle mode of a plurality of vehicle modes based on user selection and/or automatic selection of the particular vehicle mode. In one embodiment, each of the plurality of vehicle modes may impact the mechanical, electrical, and/or dynamic operation of the vehicle 102 during one or more driving conditions. For example, one or more of the vehicle modes may pertain a respective tightness or looseness of a steering of the vehicle 102, a respective suspension setting of the vehicle 102, a respective engine operation of the vehicle 102, and the like.

In an exemplary embodiment, the plurality of vehicle modes of the vehicle 102 may include but may not be limited to, an economy mode (eco-mode), a comfort mode, a sport mode, a snow mode, an autonomous mode, a quiet mode, and the like. As discussed below, upon determining the particular vehicle mode that is selected by the vehicle mode control system 108, the dynamic audio application 106 may select one or more particular audio effects that may alter (e.g., modify) a particular audio stream being played through the audio system 110 based on the manually selected vehicle mode of the vehicle 102 that may occur based on a driver's selection of one or more of vehicle modes.

The dynamic audio application 106 may also select one or more audio effects that alter a particular audio stream being played through the audio system 110 based on an automatically selected vehicle mode of the vehicle 102 that may be automated selected by the vehicle mode control system 108 based on a driver's driving style, road conditions, and/or environmental conditions at a particular point in time. The driver's driving style may be based on a speed of the vehicle 102, a braking rate of the vehicle 102, an acceleration rate of the vehicle 102, a braking force of the vehicle 102, a steering angle of the vehicle 102, and the like at one or more points in time. In some embodiments, one or more particular vehicle modes of the vehicle 102 may also be automatically selected based on road conditions. Additionally, one or more particular vehicle modes of the vehicle 102 may be automatically selected based on environmental conditions such as weather conditions, traffic conditions, and additional extrinsic conditions (e.g., slickness of the roadway on which the vehicle 102 is traveling, wind speed) that may persist within a surrounding environment of the vehicle 102.

As discussed below, the dynamic audio application 106 may be configured to operably control one or more of the audio sources 112 to provide the one or more audio streams being played through the audio system 110 in one or more manners. In particular, the one or more audio streams may be altered with one or more audio effects to provide an immersive audio experience within the vehicle 102 based on the manually or automatically selected vehicle mode of the vehicle 102. The altering of the audio streams with one or more types of audio effects may provide a listener with the sensation of being located within one or more environments that may compliment and/or correspond with the selected vehicle mode of the vehicle 102.

In particular, the altering of one or more audio streams with one or more types of audio effects may also provide a listener with a sensation of being located in one or more types and sizes of environments and/or one or more specific venues (e.g., a particular opera house), and/or environments that may include one or more particular sound effects. The audio effects may provide the listener with an acoustic experience that may replicate one or more environments that are larger than a physical size of an interior cabin of the vehicle 102, one or more environments that are equivalent to the physical size of the interior cabin of the vehicle 102, one or more environments that are smaller than the physical size of the interior cabin of the vehicle 102, one or more environments that replicate acoustics heard at one or more specific venues, and/or one or more environments that may include one or more particular sound effects that are based on the selected vehicle mode of the vehicle 102.

With reference to the components of the vehicle 102, the ECU 104 may operably control a plurality of components of the vehicle 102. In an exemplary embodiment, the ECU 104 of the vehicle 102 may include a processor (not shown), a memory, a disk (not shown), and an input/output (I/O) interface (not shown), which are each operably connected for computer communication via a bus (not shown). The I/O interface provides software and hardware to facilitate data input and output between the components of the ECU 104 and other components, networks, and data sources, of the system 100. In one embodiment, the ECU 104 may execute one or more operating systems, applications, and/or interfaces that are associated with the vehicle 102.

In one or more configurations, the ECU 104 may be in communication with a head unit 114. The head unit 114 may include internal processing memory, an interface circuit, and bus lines (components of the head unit not shown) for transferring data, sending commands, and communicating with the components of the vehicle 102. In one or more embodiments, the ECU 104 and/or the head unit 114 may execute one or more operating systems, applications, and/or interfaces that are associated to the vehicle 102 through one or more display units (not shown) located within the vehicle 102.

In one embodiment, the display unit(s) may be disposed within various areas of the interior cabin of the vehicle 102 (e.g., center stack area, behind seats of the vehicle 102) and may be utilized to display one or more application human interfaces (application HMI) associated with dynamic audio application 106. In particular, the application 106 may utilize the display unit(s) of the vehicle 102 to present one or more user interfaces that are part of the application HMI of the dynamic audio application 106. In one configuration, the one or more user interfaces may allow the listener to manually select one or more particular types of audio effects that the listener would like to have selected to listen to a particular audio stream in a particular manner. For example, the one or more user interfaces may allow the listener to manually select audio effects that may provide the listener with a sensation of being located in a larger expansive environment within the vehicle 102. The one or more user interfaces may also allow the listener to manually select one or more audio sources 112 to be controlled to provide the one or more audio effects that may be manually selected by the listener or automatically selected based on the vehicle mode of the vehicle 102.

In another configuration, the one or more user interfaces may allow the listener to selectively enable one or more audio effects that replicate a particular pre-stored environment that may be consistent with one or more real-world venue audio environments. For example, the one or more user interfaces may allow the listener to selectively enable one or more audio effects that are associated with venue names that may be individually selected to replicate acoustics heard at a respective venue (e.g., a particular opera house). Upon the selection of the one or more audio effects, the application 106 may be configured to select one or more audio effects which replicate the acoustics that may be typically heard within the particular venue through one or more particular audio sources 112 of the vehicle 102.

In some embodiments, the one or more user interfaces may enable or disable the functionality of the dynamic audio application 106 with respect to the selection of one or more audio effects based on the selection of one or more vehicle modes of the vehicle 102. In circumstances that this functionality of the dynamic audio application 106 is disabled, the dynamic audio application 106 may select one or more default audio effects that may pertain to a respective format of the audio stream being played through the audio system 110 (discussed in more detail below).

In some embodiments, the one or more user interfaces may allow the listener to enable or disable additional vehicle effects that may be provided by the dynamic audio application 106 during selection of one or more audio effects and/or control of one or more particular audio sources 112 to provide the one or more audio effects. Such additional vehicle effects may include, but may not be limited to, digital effects that may be presented through one or more display screens, lighting effects that may be provided by one or more lighting sources within the interior cabin of the vehicle 102 and/or disposed at one or more external portions of the vehicle 102, seat adjustment effects that may pertain to one or more seats of the vehicle 102, climate control effects that may pertain to a climate control system (not shown) of the vehicle 102, and the like. For example, the one or more user interfaces may allow the listener to enable or disable various color temperatures of LED mood lighting effects of one or more lighting sources to promote sensations that may match one or more audio effects that are provided through one or more of the audio sources 112.

In an exemplary embodiment, the vehicle 102 may additionally include a storage unit 116. The storage unit 116 may store one or more operating systems, applications, associated operating system data, application data, vehicle system and subsystem user interface data, and the like that are executed by the ECU 104, the head unit 114, and one or more applications executed by the ECU 104 and/or the head unit 114 including the dynamic audio application 106.

In one or more embodiments, the storage unit 116 may be configured to store an audio stream data repository 118. The audio stream data repository 118 may be configured to store one or more audio streams in the form of executable files, that may include, but may not be limited to, one or more audio files, one or more video files, and/or one or more application files that may be accessed and executed by one or more components of the vehicle 102 and/or the dynamic audio application 106.

In one embodiment, the audio stream data repository 118 may also be configured to store one or more audio profiles (e.g., executable data files) that may include instructions to select particular default audio effects and/or control particular audio sources 112 to provide various types of dynamic audio environments that are associated with formats that include, but are not limited to, music, speech, live events and the like.

In one or more embodiments, the one or more audio profiles may also be configured to store data associated with particular audio effects that may be selected by the application 106. Such data may include particular audio effects that may be associated with particular vehicle modes of the vehicle 102. As discussed below, the dynamic audio application 106 may be configured to analyze a current audio stream that is being played through the audio system 110 to determine the format of the current audio stream. Upon determining the format of the current audio stream, the dynamic audio application 106 may be configured to access the audio stream data repository 118 to determine one or more default audio effects that may be associated with the format of the respective audio stream. The one or more default audio effects may pertain to audio effects that may be pre-stored as being suited for playing the respective format of the respective audio stream in a particular manner. For example, the one or more default audio effects may provide a predetermined level of mechanical audio effects, echoing audio effects, full range audio effects, midrange audio effects, high-bass audio effects, high-treble audio effects, high midrange audio effects, mid-bass audio effects, nose-canceling audio effects that may be based on the format of the audio stream being played through the audio system 110. As discussed below, the one or more default audio effects may be modified to one or more audio effects that are based on the selected vehicle mode of the vehicle 102 to alter the one or more audio streams and provide a dynamic audio environment to one or more listeners within the vehicle 102.

In one configuration, the audio stream data repository 118 may also be configured to store one or more audio profiles that may be associated with one or more particular listeners. The one or more listeners may utilize the one or more user interfaces of the dynamic audio application 106 to set one or more audio profiles that may include desired audio settings that may pertain to the selection of particular audio effects and/or the control particular audio sources 112 to provide various types of dynamic audio environments based on preferences of one or more particular listeners. In some circumstances, this functionality may allow one or more listeners to manually enable various simulated environments within the vehicle 102. For example, a listener may utilize a user interface of the dynamic audio application 106 to select a simulated environment of a particular venue to enable the application 106 to select one or more of particular audio effects and/or to control particular audio sources 112 to provide a simulated acoustic experience of being located at particular venue within the vehicle 102.

In an exemplary embodiment, the ECU 104 may be operably connected to the vehicle mode control system 108. As discussed, the vehicle mode control system 108 may be configured to select a particular vehicle mode of a plurality of vehicle modes based on user selection and/or automatic selection of the particular vehicle mode. In one embodiment, the vehicle mode control system 108 may be operably connected to vehicle mode setting input switches (not shown) that may be configured to be included within an interior cabin of the vehicle 102 (e.g., dashboard, center console, etc.). The vehicle mode setting input switches may be configured as input buttons, dials, rotary knobs, and the like and may be configured to be selected to allow the driver of the vehicle 102 to manually select one or more vehicle modes of the plurality of vehicle modes of the vehicle 102.

In one configuration, the vehicle mode control system 108 may be configured to receive electronic signals from the vehicle mode setting input switches upon the selection of one or more respective vehicle modes of the vehicle 102 from the driver of the vehicle 102. The dynamic audio application 106 may be configured to communicate with the vehicle mode control system 108 to thereby determine the current vehicle mode of the vehicle 102 based on the manual selection of the particular vehicle mode of the vehicle 102.

In one embodiment, the vehicle mode control system 108 may be configured to automatically select one or more vehicle modes of the plurality of vehicle modes of the vehicle 102 based on sensor data that may pertain to the driver's driving style, road conditions, and/or environmental conditions at a particular point in time. In particular, the vehicle mode control system 108 may be configured to receive the sensor data from vehicle sensors 120 of the vehicle 102 that may provide the vehicle mode control system 108 with data that may be analyzed to determine driver's driving style, road conditions, and/or environmental conditions at a particular point in time.

In one or more embodiments, the vehicle sensors 120 may be configured to receive inputs from one or more vehicle systems, sub-systems, control units, and the like. For example, the vehicle sensors 120 may be configured to receive inputs from a transmission control unit, engine control unit, suspension control unit, steering control unit, and the like that may pertain to respective vehicle system and subsystem operations. In one embodiment, the vehicle sensors 120 may be included as part of a Controller Area Network (CAN) of the vehicle 102 and may be configured to provide vehicle dynamic data to the vehicle mode control system 108 to be analyzed to automatically select one or more vehicle modes of the plurality of vehicle modes of the vehicle 102. The vehicle sensors 120 may include, but may not be limited to, position sensors, heading sensors, speed sensors, steering speed sensors, steering angle sensors, throttle angle sensors, accelerometers, magnetometers, gyroscopes, yaw rate sensors, brake force sensors, wheel speed sensors, wheel turning angle sensors, transmission gear sensors, temperature sensors, RPM sensors, GPS/DGPS sensors, and the like (individual sensors not shown).

Accordingly, sensor data provided by the vehicle sensors 120 may be analyzed by the vehicle mode control system 108 to determine the driver's driving style, road conditions, and/or environmental conditions at a particular point in time. The vehicle mode control system 108 may thereby automatically select one or more particular vehicle modes at one or more points in time that may be based on the driver's driving style, the road conditions, and/or environmental conditions at a particular point in time.

In an exemplary embodiment, the audio system 110 may be configured to provide (e.g., playback) audio through one or more of the audio sources 112 located within a plurality of locations of the interior cabin of the vehicle 102. The audio system 110 may communicate with one or more additional vehicle systems (not shown) and/or components to provide audio pertaining to one or more interfaces, alerts, warnings, and the like that may be provided by such systems.

In some embodiments, the audio system 110 may be configured to execute audio files that include one or more audio streams stored on the storage unit 116. For example, one or more users may store one or more music files (e.g., MP3 files) of a music library on the storage unit 116 to be accessed and executed by the audio system 110 for playback within the vehicle 102. In additional embodiments, the audio system 110 may be operably connected to a radio receiver (not shown) that may receive radio frequencies and/or satellite radio signals from one or more antennas (not shown) that intercept AM/FM frequency waves and/or satellite radio signals.

In one embodiment, the audio system 110 may be configured to receive one or more commands from one or more components of the dynamic audio application 106 to control one or more audio sources 112 of the vehicle 102. In one or more configurations, the audio sources 112 of the vehicle 102 may include, but may not be limited to, component speakers, full range speakers, tweeter speakers, midrange speakers, mechanical speakers, high-bass speakers, high-treble speakers, high-midrange speakers, mid-bass speakers, subwoofers, nose-canceling speakers and the like. It is to be appreciated that the audio sources 112 may include one or more components of the aforementioned speaker types that may be provided within a single form factor and/or multiple form factors. The audio sources 112 may be individually configured (e.g., based on the speaker type) to provide one or more particular audio effects at one or more audio frequencies to replicate one or more environments to the listener within the vehicle 102.

As an illustrative example, full range speakers and/or component speakers may be utilized to provide a generally broad (mid-low to mid-high) range of audio effects that may be utilized replicate certain environments, tweeter speakers may be utilized to provide a high/very high range of audio effects that may be utilized replicate certain environments, midrange speakers may be configured to cover middle range audio effects that may be utilized replicate certain environments, and the subwoofer may be utilized to provide a low to very low range audio effects that may be utilized to replicate certain environments. In some configurations, the dynamic audio application 106 may send one or more commands to the audio system 110 to control the audio sources 112 configured as noise-cancelling speakers to emit a frequency of sound to interfere with a similar sound frequency of a particular sound(s) to reduce ambient noise within the vehicle 102.

Figure 2:
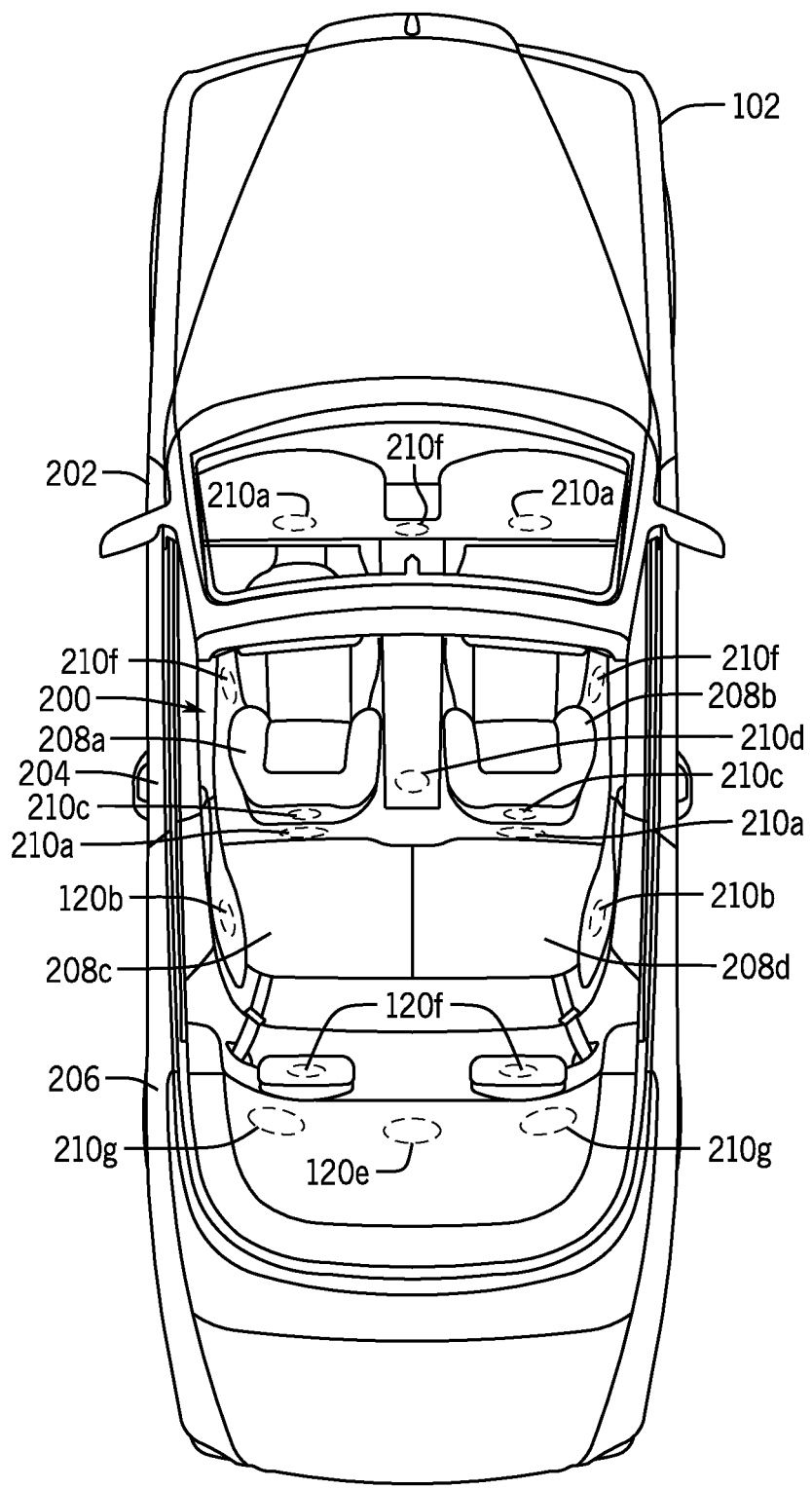
FIG. 2 is an illustrative example of various types of audio sources may be provided within a plurality of areas of an interior cabin of the vehicle according to an exemplary embodiment of the present disclosure.

As shown in the illustrative example of FIG. 2, various types of audio sources 112 may be provided within a plurality of areas of the interior cabin 200 of the vehicle 102 according to an exemplary embodiment of the present disclosure. For example, audio sources 112 in the form of speakers 210 that are configured as full range speakers 210a and/or component speakers 210b may be provided at a front portion 202 of the vehicle 102, at a middle portion 204 of the vehicle 102, at a rear portion 206 of the vehicle 102, and/or at or near one or more of the seats 208a-208d of the vehicle 102. Additionally, speakers 210 that are configured as tweeter speakers 210c, midrange speakers 210d, mid-bass speakers 210e, noise-canceling speakers 210f, and/or subwoofers 210g may be provided at the front portion 202, at or near one or more of the seats 208a-208d of the vehicle 102, at the middle portion 204, and the rear portion 206 of the vehicle 102.

In one embodiment, the dynamic audio application 106 may communicate command(s) to the audio system 110 to utilize one or more of the audio sources 112 configured as particular types of speakers 210 to provide particular audio effects based on the selected vehicle mode of the vehicle 102. The particular audio effect may be associated with one or more audio frequencies, one or more echoing audio effects, and the like at one or more particular portions 202, 204, 206 of the vehicle 102 and/or at or near one or more of the seats 208a-208d of the vehicle 102. Consequently, one or more of the audio effects may be provided via one or more particular types of audio sources 112 that are configured (e.g., best suited) to provide the particular one or more particular audio effects to replicate one or more dynamic environments for the listener within the vehicle 102.

In some embodiments, the application 106 may also determine the location of the listener within the vehicle 102 to operably control one or more of the audio sources 112 to provide one or more particular audio effects in one or more manners to replicate one or more dynamic environments for the listener. For example, the dynamic audio application 106 may determine the location of occupants within the front passenger seats 208a, 208b of the vehicle 102 based on seat sensors (not shown), image sensors (not shown), and the like and may operably control one or more speakers 210a, 210b, 210f to provide one or more audio effects that may replicate one or more dynamic environments for the occupant listeners.

II. The Dynamic Audio Environment Application and Exemplary Methods Executed by the Application In an exemplary embodiment, the dynamic audio application 106 may be stored on the storage unit 116 of the vehicle 102 to be executed by the ECU 104 and/or the head unit 114 of the vehicle 102. In additional embodiments, the dynamic audio application 106 may be stored on an externally hosted server infrastructure (not shown) or external computing device (not shown) and may be accessed and executed by the ECU 104 and/or the head unit 114 of the vehicle 102.

As discussed, the dynamic audio application 106 may be configured to operably control one or more of the audio sources 112 to provide the one or more audio streams based on one or more audio effects to provide an immersive audio experience within the vehicle 102. The one or more types of audio effects may include, but may not be limited to, mechanical audio effects, echoing audio effects, full range audio effects, midrange audio effects, high-bass audio effects, high-treble audio effects, high midrange audio effects, mid-bass audio effects, nose-canceling audio effects, and the like.

Some non-limiting illustrative examples of one or more audio effects that may be may pertain to one or more particular vehicle modes of the vehicle 102 that are selected by the dynamic audio application 106 will now be discussed. However, it is to be appreciated that numerous types of audio effects and/or combination of audio effects that may alter one or more audio streams may be provided during the selection of any of the vehicle modes. With particular reference to the one or more audio effects, the one or more audio effects may be provided in a manner that may allow a listener to feel as if the interior cabin of the vehicle 102 is more expansive based on the use of expansive echoing audio effects that may be provided through one or more particular audio sources 112. For example, if the vehicle 102 is determined to be in an eco-mode vehicle mode, the dynamic audio application 106 may be configured to select expansive echoing audio effects that may be provided through one or more particular audio sources 112 to give the listener a sensation of an expansive environment that may replicate a large opera house. This may provide the listener with an immersive experience that allows the listener to have a sensation of being in a simulated large environment (e.g., similar to a stadium, arena, opera house, auditorium) within the interior cabin of the vehicle 102. Accordingly, one or more audio streams may be provided in a manner through one or more selected audio sources 112 that may also provide a sensation of relaxation to the listener.

The one or more audio effects may also be selected by the application 106 in a manner that allow a transition effect of a sensation of being located within larger expansive environment to being located in an environment that is consistent with the size of an interior cabin environment of the vehicle 102. In other words, the one or more audio effects may be selected in a manner that are consistent with echoing and sound waves that are customarily heard within the interior cabin of the vehicle 102. Such audio effects may be provided by decreasing or removing the echoing audio effects and controlling one or more particular audio sources 112 that may enable the listener to hear one or more audio effects that provide the listener with a sensation of being located within an environment that is the size of the interior cabin environment of the vehicle 102. For example, if the vehicle mode of the vehicle 102 is determined to transition from the eco-mode to a comfort mode, one or more audio effects may be adjusted, ceased, and/or selected to transition from providing echoing audio effects that may replicate a larger expansive environment (e.g., concert hall) to an environment that is the consistent with the size of the interior cabin environment of the vehicle 102 (e.g., a uniquely in-vehicle audio experience).

The one or more audio effects may additionally be provided in a manner that allows a transition effect of the sensation of being located within an environment that is the size of the interior cabin environment of the vehicle 102 to the size and feel of a smaller more intimate environment. Such an environment may be provided by modifying particular audio effects and controlling one or more particular audio sources 112 to allow the listener to feel as if they are in a smaller, tighter, and/or more intimate environment. For example, if the vehicle mode of the vehicle 102 is determined to transition from the eco-mode or comfort mode to the sport mode, one or more audio effects may be adjusted and selected to transition from replicating a larger expansive environment or the vehicle interior cabin environment to a tighter more intimate smaller environment that may enable the listener to focus on the road and feel as if they have full control of the vehicle 102 (e.g., as the suspension and steering may be stiff in the sport mode vehicle mode).

The one or more audio effects may be provided in various manners that may be associated with the various vehicle modes that are selected by the vehicle mode control system 108 to replicate an environment in which different sound effects may be created and provided using different types of audio sources 112. In some embodiments, different sound effects may be provided through one or more audio effects to replicate external environments. For example, one or more audio effects may be provided by one or more selected audio sources 112 when it is determined that the vehicle 102 is in the snow mode to enable the listener to feel as if snow is absorbing sound waves and the sound is being dampened. It is appreciated that the dynamic audio application 106 may select numerous types and modifications of audio effects by controlling one or more types of audio sources 112 to provide various listening environments to the listener based on the selected vehicle mode of the vehicle 102 and/or based on manual selection of one or more audio effects by the listener.

Figure 3:
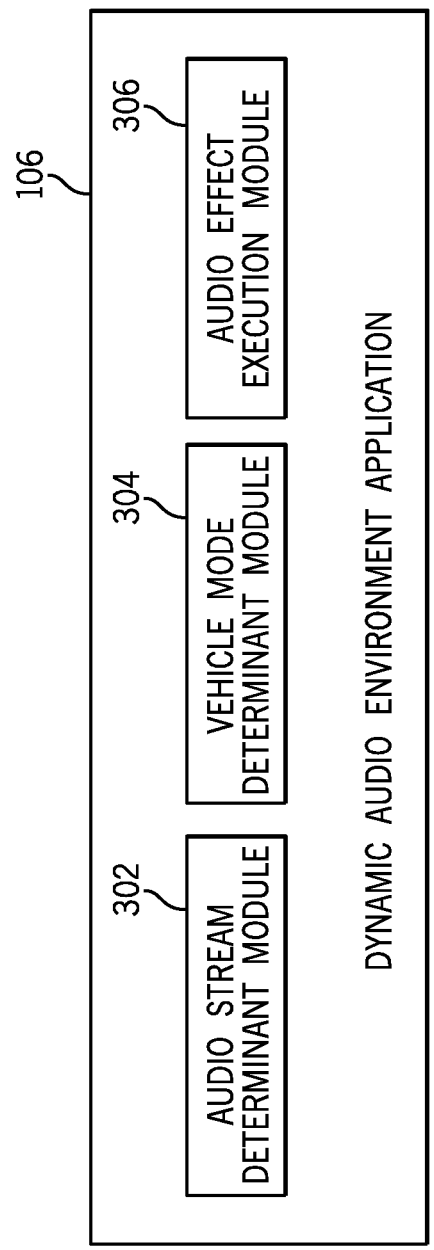
FIG. 3 is a schematic overview of a plurality of modules of a dynamic audio application that is configured to execute computer-implemented instructions to provide the dynamic audio environment within the vehicle according to an exemplary embodiment of the present disclosure.

FIG. 3 is a schematic overview of a plurality of modules 302-306 of the dynamic audio application 106 that are configured to execute computer-implemented instructions to provide the dynamic audio environment within the vehicle 102 according to an exemplary embodiment of the present disclosure. In an exemplary embodiment, the plurality of modules 302-306 may include an audio stream determinant module 302, a vehicle mode determinant module 304, and an audio effect execution module 306. It is to be appreciated that the dynamic audio application 106 may include one or more additional modules and/or sub-modules that are included in additional to or in lieu of the modules 302-306.

In one embodiment, the audio stream determinant module 302 may be configured to communicate with the audio system 110 of the vehicle 102 to determine a format of audio stream that may be currently played through the audio system 110 to be provided through the audio sources 112. As discussed, the one or more audio streams may include one or more formats of audio that may be provided in various formats including, but not limited to, music, speech, and/or live events.

In an exemplary embodiment, each audio stream format may be associated with the enablement of one or more default audio effects that may be associated with each of the respective formats. Accordingly, the audio stream determinant module 302 may analyze one or more sound clips of a predetermined length (e.g., 3 second sound clips at one or more portions of the audio stream) associated with a current audio stream to determine the format of the current audio stream. In some configurations, the audio stream determinant module 302 may analyze a digitally encrypted audio description that may be provided through radio waves, satellite based signals, and/or through a digital audio file to determine the format of the current audio stream. Upon determining the format of the current audio stream, the audio stream determinant module 302 may be configured to access the audio stream data repository 118 stored upon the storage unit 116 to determine one or more default audio effects that may be associated with the format of the respective audio stream.

As discussed, the one or more default audio effects may pertain to audio effects that may be pre-stored as being suited for playing back the respective format of the respective audio stream. In particular, the one or more default audio effects that may be associated with the format of the respective audio stream may be selected to provide the audio stream at one or more audio frequencies, with one or more echoing audio effects, at one or more treble levels, at one or more bass levels, and the like, through one or more audio sources 112 located at one or more particular portions 202, 204, 206 of the vehicle 102 and/or at or near one or more of the seats 208a-208d of the vehicle 102.

In some embodiments, the one or more default audio effects may be configured to replicate particular environments based on the format of the audio stream being played through the audio system 110. For example, if a current audio stream is determined to be a live event format that includes a live sporting event, the application 106 may select one or more default audio effects that may replicate a particular stadium environment in which the live sporting event is taking place. Upon determining the one or more default audio effects that may be associated with the format of the current audio stream, the audio stream determinant module 302 may be configured to communicate the one or more default audio effects to the audio effect execution module 306.

In an exemplary embodiment, the vehicle mode determinant module 304 may be configured to determine a current vehicle mode of the vehicle 102 as selected by the vehicle mode control system 108. As discussed above, the vehicle mode control system 108 may be configured to select a particular vehicle mode of the vehicle 102 based on a manual selection of the vehicle mode by the driver of the vehicle 102. Additionally, the vehicle mode control system 108 may be configured to select a particular vehicle mode of a plurality of vehicle modes of the vehicle 102 based on an automatic selection of the vehicle mode by the vehicle mode control system 108. Upon determining the current vehicle mode of the vehicle 102, the vehicle mode determinant module 304 may be configured to communicate the current vehicle mode of the vehicle 102 to the audio effect execution module 306 of the dynamic audio application 106.

In an exemplary embodiment, the audio effect execution module 306 of the dynamic audio application 106 may be configured to analyze the current vehicle mode of the vehicle 102 as communicated by the vehicle mode determinant module 304. The audio effect execution module 306 may additionally be configured to analyze the one or more default audio effects that may be associated with the format of the respective audio stream as communicated by the audio stream determinant module 302. Upon analyzing the current vehicle mode of the vehicle 102 and the one or more default audio effects, the audio effect execution module 306 may be configured to alter the audio stream by modifying the one or more default audio effects to select one or more audio effects that pertain to the vehicle mode of the vehicle 102.

In one or more embodiments, the audio effect execution module 306 may be configured to operably control the audio system 110 to select the one or more audio effects to be provided within the vehicle 102. In particular, upon modifying the one or more default audio effects to one or more audio effects that pertain to the selected vehicle mode of the vehicle 102, the audio effect execution module 306 may be configured to communicate with the audio system 110 to provide the one or more audio effects by one or more select audio sources 112 of the vehicle 102 to give the listener a particular sensation of being located in one or more types and sizes of environments and/or one or more specific venues that may be associated with the vehicle mode of the vehicle 102. Accordingly, the dynamic audio application 106 may alter the audio stream being played within the vehicle 102 to correspond with the vehicle mode of the vehicle 102 to provide an immersive dynamic audio environment within the vehicle 102.

Figure 4:
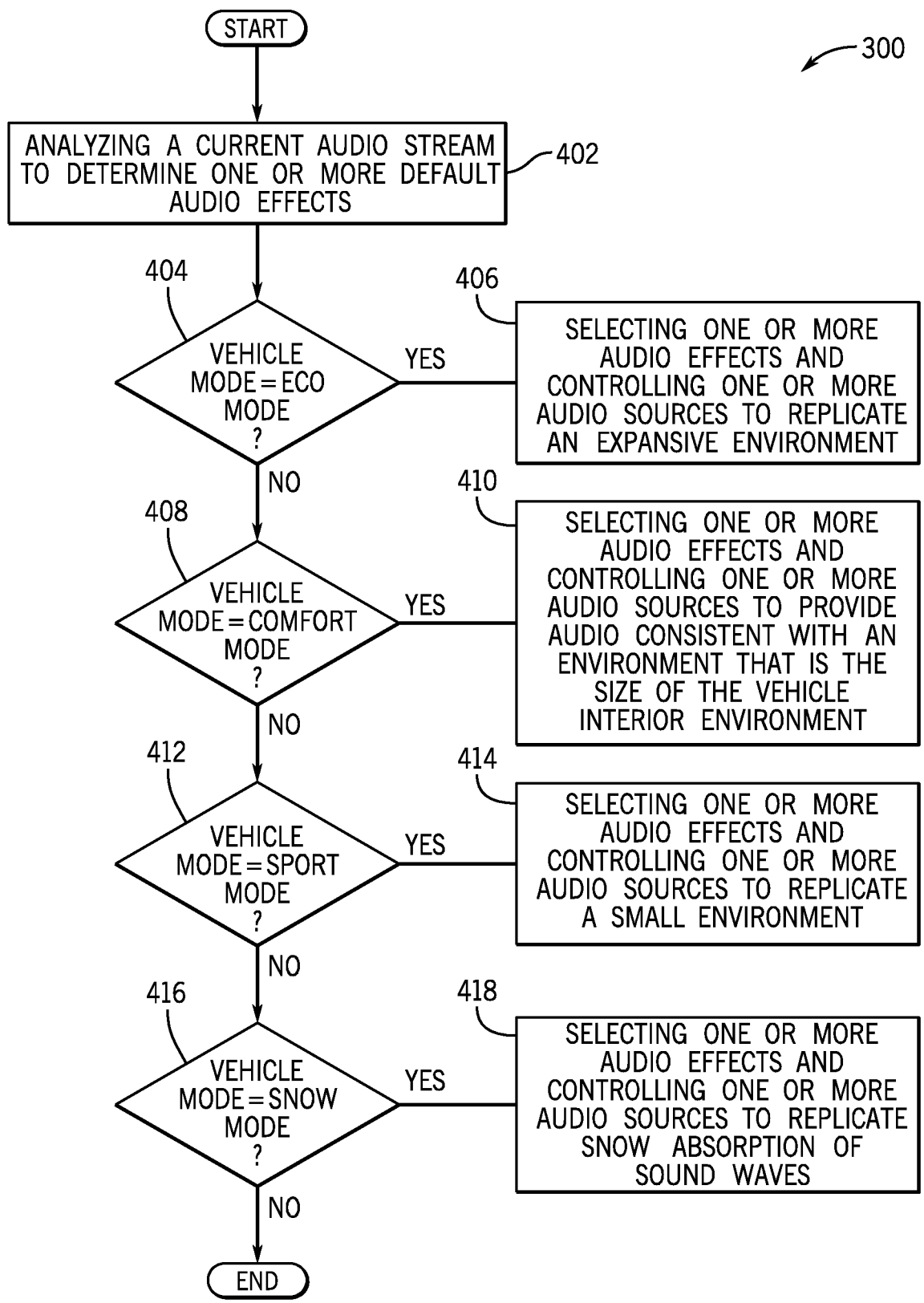
FIG. 4 is a process flow diagram of a method for implementing one or more audio effects and controlling one or more audio sources to provide the one or more audio effects according to an exemplary embodiment of the present disclosure.

FIG. 4 is a process flow diagram of a method 400 for selecting one or more audio effects and controlling one or more audio sources 112 to provide the one or more audio effects according to an exemplary embodiment of the present disclosure. FIG. 4 will be described with reference to the components of FIG. 1, FIG. 2, and FIG. 3 though it is to be appreciated that the method of FIG. 4 may be used with other systems and/or components. In the method of FIG. 4, a specific order of determining vehicle modes of the vehicle 102 are shown (i.e., eco-mode, comfort mode, sport mode, snow mode), however, it is understood that the method 400 and systems described herein may determine the vehicle modes of the vehicle 102 in any order and/or may determine additional or alternate vehicle modes of the vehicle 102. Additionally, it is to be appreciated that numerous types of audio effects and/or combination of audio effects to alter one or more audio streams that may not be specifically discussed below may be provided during the selection of any of the vehicle modes discussed in the process steps below and/or additional/alternate vehicle modes that are not discussed in the process steps below.

The method 400 may begin at block 402, wherein the method 400 may include analyzing a current audio stream to determine one or more default audio effects. In an exemplary embodiment, the audio stream determinant module 302 of the dynamic audio application 106 may be configured to communicate with the audio system 110 of the vehicle 102 to receive data associated with one or more audio streams being played back through one or more audio sources 112 of the vehicle 102. The audio stream determinant module 302 may be configured to communicate with the audio system 110 of the vehicle 102 to determine a format of an audio stream that may be currently played through the audio system 110 to be played through the audio sources 112. In one configuration, the audio stream determinant module 302 may analyze the received data associated with the current audio stream.

In one embodiment, the audio stream determinant module 302 may analyze one or more sound clips of a predetermined length (e.g., 3 second sound clips at one or more portions of the audio stream) associated with a current audio stream to determine the format of the current audio stream. In another embodiment, the audio stream determinant module 302 may communicate with the audio system 110 to determine a digitally encrypted audio description that may be provided to the audio system 110 through radio waves, satellite based signals, and/or through a digital audio file to determine the format of the current audio stream.

Upon determining the format of the current audio stream, the audio stream determinant module 302 may be configured to access the audio stream data repository 118 stored upon the storage unit 116 to determine one or more default audio effects that may be associated with the format of the respective audio stream. Upon determining the one or more default audio effects that may be associated with the format of the current audio stream, the audio stream determinant module 302 may be configured to communicate the one or more default audio effects to the audio effect execution module 306.

The method 400 may proceed to block 404, wherein the method 400 may include determining if the vehicle mode is the eco-mode. In an exemplary embodiment, the vehicle mode determinant module 304 of the dynamic audio application 106 may be configured to communicate with the vehicle mode control system 108 to determine a current vehicle mode of the vehicle 102. As discussed, the vehicle mode control system 108 may select a particular vehicle mode based on manual selection of the vehicle mode by a driver of the vehicle 102. Alternatively, the vehicle mode control system 108 may automatically select the vehicle mode based on data provided by the vehicle sensors 120 of the vehicle 102 that may be analyzed to determine driver's driving style, road conditions, and/or environmental conditions at a particular point in time. In one embodiment, the vehicle mode control system 108 may communicate the currently selected vehicle mode to the vehicle mode determinant module 304. If the vehicle mode is communicated by the vehicle mode control system 108 as the eco-mode, the vehicle mode control system 108 may determine that the vehicle mode is the eco-mode.

If it is determined that the vehicle mode is the eco-mode (at block 404), the method 400 may proceed to block 406, wherein the method 400 may include selecting one or more audio effects and controlling one or more audio sources 112 to replicate an expansive environment. In an exemplary embodiment, the audio effect execution module 306 may be configured to communicate with the audio stream determinant module 302 to receive one or more default audio effects that may be determined by the module 302 as being associated with the format of the current audio stream. The audio effect execution module 306 may additionally be configured to analyze the one or more default audio effects that may be associated with the format of the respective audio stream.

The audio effect execution module 306 may also be configured to communicate with the vehicle mode determinant module 304 to determine the currently selected vehicle mode of the vehicle 102. Accordingly, the vehicle mode determinant module 304 may communicate that the currently selected vehicle mode is the eco mode. In an exemplary embodiment, upon determining that the vehicle mode is the eco-mode, the audio effect execution module 306 may be configured to alter the audio stream by modifying the one or more default audio effects to one or more audio effects that pertain to the eco-mode vehicle mode. In particular, the audio effect execution module 306 may be configured to communicate with the audio system 110 to modify the one or more default audio effects to select one or more audio effects as echoing audio effects that may be provided by one or more select audio sources 112 of the vehicle 102 to give the listener the feeling of an expansive environment that may replicate a large opera house.

In one configuration, during the transition from the one or more default audio effects to the echoing audio effects, the audio effect execution module 306 may communicate with the audio system 110 to provide a transition effect that may selectively utilize mechanical audio effects, echoing audio effects, full range audio effects, midrange audio effects, high-bass audio effects, high-treble audio effects, high midrange audio effects, mid-bass audio effects, nose-canceling audio effects, and the like to provide a sensation of an area of expansion with respect to the cabin of the vehicle 102. Such a sensation may be associated with acoustics that provide a feeling of increasing from an environment that is the size of the interior cabin environment of the vehicle 102 to a larger expansive environment. Upon providing the transitioning effect through one or more audio sources 112, the audio effect execution module 306 may operably control the audio system 110 to provide the audio stream through one or more of the audio sources 112 in a manner that gives the listener the feeling of an expansive environment that may replicate a large opera house as the vehicle 102 is being driven in the eco-mode vehicle mode.

If it is determining that the vehicle mode is not the eco-mode (at block 404), the method 400 may proceed to block 408, wherein the method 400 may include determining if the vehicle mode is the comfort mode. As discussed above, the vehicle mode determinant module 304 may be configured to communicate with the vehicle mode control system 108 to determine a currently selected vehicle mode of the vehicle 102. In one embodiment, the vehicle mode control system 108 may communicate the currently selected vehicle mode to the vehicle mode determinant module 304. If the currently selected vehicle mode is communicated by the vehicle mode control system 108 as the comfort mode, the vehicle mode control system 108 may determine that the vehicle mode is the comfort mode.

If it is determined that the vehicle mode is the comfort mode (at block 408), the method 400 may proceed to block 410, wherein the method 400 may include selecting one or more audio effects and controlling one or more audio sources 112 to provide audio consistent with an environment that is the size of the vehicle interior environment. As discussed, the audio effect execution module 306 may be configured to communicate with the audio stream determinant module 302 to receive one or more default audio effects that may be determined by the module 302 as being associated with the format of the current audio stream. The audio effect execution module 306 may additionally be configured to analyze the one or more default audio effects that may be associated with the format of the respective audio stream.

The audio effect execution module 306 may also be configured to communicate with the vehicle mode determinant module 304 to determine the currently selected vehicle mode of the vehicle 102. Accordingly, the vehicle mode determinant module 304 may communicate that the currently selected vehicle mode is the comfort mode. In an exemplary embodiment, upon determining that the vehicle mode is the comfort mode, the audio effect execution module 306 may be configured to alter the audio stream by modifying the one or more default audio effects to one or more audio effects that pertain to the comfort mode vehicle mode. In particular, the audio effect execution module 306 may be configured to communicate with the audio system 110 to select one or more audio effects that may be provided by one or more select audio sources 112 of the vehicle 102 to give the listener a sensation of being located within an environment that is consistent with the size of the interior cabin 200 of the vehicle 102. In other words, the one or more audio effects may be selected in a manner that are consistent with echoing and sound waves that are heard normally within an interior cabin 200 of the vehicle 102.

In one configuration, during the transition to one or more audio effects that may be provided by one or more select audio sources 112 of the vehicle 102 to give the listener a sensation that is consistent with an environment that is the size of the interior cabin 200, the audio effect execution module 306 may communicate with the audio system 110 to provide a transition effect that may selectively utilize mechanical audio effects, echoing audio effects, full range audio effects, midrange audio effects, high-bass audio effects, high-treble audio effects, high midrange audio effects, mid-bass audio effects, nose-canceling audio effects, and the like to provide a sensation of an area of the cabin of the vehicle 102 changing to an environment that is the size of the vehicle interior environment. Such a sensation may be associated with acoustics that provide a feeling of being relocated from an environment that is the size of a larger expansive environment to an environment that is the size of the interior cabin of the vehicle 102. Alternatively, such a sensation may be associated with acoustics that provide a feeling of being relocated from an environment that is the size of a smaller environment to an environment that is the size of the interior cabin of the vehicle 102

As an illustrative example, if the vehicle 102 is determined to transition from the eco-mode to the comfort mode, one or more audio effects may be provided as a transition effect to provide a transition from providing echoing audio effects that may replicate a larger expansive environment such as a concert hall to an environment that is the consistent with the size of the interior cabin environment of the vehicle 102 (e.g., that may provide a uniquely in-vehicle audio experience). The audio effect execution module 306 may thereby operably control the audio system 110 to provide the audio stream through one or more of the audio sources 112 in a manner that gives the listener the feeling of being located within the vehicle interior cabin.

With continued reference to FIG. 4, if it is determined that the vehicle mode is not the comfort mode (at block 408), the method 400 may proceed to block 412, wherein the method 400 may include determining if the vehicle mode is the sport mode. In one embodiment, the vehicle mode control system 108 may communicate the currently selected vehicle mode to the vehicle mode determinant module 304. If the currently selected vehicle mode is communicated by the vehicle mode control system 108 as the sport mode, the vehicle mode control system 108 may determine that the vehicle mode is the sport mode.

If it is determined that the vehicle mode is the sport mode (at block 412), the method 400 may proceed to block 414, wherein the method 400 may include selecting one or more audio effects and controlling one or more audio sources 112 to replicate a small environment. As discussed, the audio effect execution module 306 may be configured to communicate with the audio stream determinant module 302 to receive one or more default audio effects that may be determined by the module 302 as being associated with the format of the current audio stream. The audio effect execution module 306 may additionally be configured to analyze the one or more default audio effects that may be associated with the format of the respective audio stream.

The audio effect execution module 306 may also be configured to communicate with the vehicle mode determinant module 304 to determine the currently selected vehicle mode of the vehicle 102. Accordingly, the vehicle mode determinant module 304 may communicate that the currently selected vehicle mode is the sport mode. In an exemplary embodiment, upon determining that the vehicle mode is the sport mode, the audio effect execution module 306 may be configured to alter the audio stream by modifying the one or more default audio effects to one or more audio effects that pertain to the sport mode vehicle mode. In particular, the audio effect execution module 306 may be configured to communicate with the audio system 110 to select one or more audio effects that may be provided by one or more select audio sources 112 of the vehicle 102 to give the listener a sensation that is consistent with being located within a smaller more intimate and tight environment.

In one configuration, during the transition to one or more audio effects that may be provided by one or more select audio sources 112 of the vehicle 102 to give the listener a sensation that is consistent with being located within the smaller more intimate and tight environment, the audio effect execution module 306 may communicate with the audio system 110 to provide a transition effect that may selectively utilize mechanical audio effects, echoing audio effects, full range audio effects, midrange audio effects, high-bass audio effects, high-treble audio effects, high midrange audio effects, mid-bass audio effects, nose-canceling audio effects, and the like to provide a sensation of an area of the cabin of the vehicle 102 changing to an environment that is the size of a larger environment to the smaller more intimate and tight environment. Such a sensation may be associated with acoustics that provide a feeling of being relocated from an environment that is the size of larger environment to an environment that is the size of a smaller more intimate and tight environment.

As an illustrative example, if the vehicle 102 is determined to transition from the eco-mode to a sport mode, one or more audio effects may be provided as a transition effect to provide a transition from providing echoing audio effects that may replicate a larger expansive environment such as a concert hall to an environment that is the smaller more intimate and tight environment. Alternatively, if the vehicle 102 is determined to transition from the comfort mode to the sport mode, one or more audio effects may be provided as a transition effect to provide a transition from providing echoing audio effects that may give the listener the feeling of being located within the vehicle interior cabin to an environment that is the smaller more intimate and tight environment. The audio effect execution module 306 may thereby operably control the audio system 110 to provide the audio stream through one or more of the audio sources 112 in a manner that gives the listener the feeling of being located within the smaller more intimate and tight environment.

With continued reference to FIG. 4, if it is determined that the vehicle mode is not the sport mode (at block 412), the method 400 may proceed to block 416, wherein the method 400 may include determining if the vehicle mode is the snow mode. In one embodiment, the vehicle mode control system 108 may communicate the currently selected vehicle mode to the vehicle mode determinant module 304. If the currently selected vehicle mode is communicated by the vehicle mode control system 108 as the snow mode, the vehicle mode control system 108 may determine that the vehicle mode is the snow mode.

If it is determined that the vehicle mode is the snow mode (at block 416), the method 400 may proceed to block 418, wherein the method 400 may include selecting one or more audio effects and controlling one or more audio sources 112 to replicate snow absorption of sound waves. In one embodiment, the audio effect execution module 306 may be configured to communicate with the audio stream determinant module 302 to receive one or more default audio effects that may be determined by the module 302 as being associated with the format of the current audio stream. The audio effect execution module 306 may additionally be configured to analyze the one or more default audio effects that may be associated with the format of the respective audio stream.

The audio effect execution module 306 may also be configured to communicate with the vehicle mode determinant module 304 to determine the currently selected vehicle mode of the vehicle 102. Accordingly, the vehicle mode determinant module 304 may communicate that the currently selected vehicle mode is the snow mode. In an exemplary embodiment, upon determining that the vehicle mode is the snow mode, the audio effect execution module 306 may be configured to alter the audio stream by modifying the one or more default audio effects to one or more audio effects that pertain to the snow mode vehicle mode. In particular, the audio effect execution module 306 may be configured to communicate with the audio system 110 to select one or more audio effects that may be provided by one or more select audio sources 112 of the vehicle 102 to give the listener a sensation of snow absorbing the sound waves of the audio stream and the sound of the audio stream being dampened. For example, one or more audio effects may be provided through one or more audio sources 112 to provide a sensation of sound being absorbed and dampened by snow that may be located on the roadway on which the vehicle 102 is traveling.

In one configuration, during the transition to one or more audio effects that may be provided by one or more select audio sources 112 of the vehicle 102 to give the listener a sensation of snow absorbing the sound waves of the audio stream and the sound of the audio stream being dampened, the audio effect execution module 306 may communicate with the audio system 110 to provide a transition effect that may selectively utilize mechanical audio effects, echoing audio effects, full range audio effects, midrange audio effects, high-bass audio effects, high-treble audio effects, high midrange audio effects, mid-bass audio effects, nose-canceling audio effects, and the like to provide a sensation of an area of the cabin of the vehicle 102 changing to an environment that provides a perception of snow absorbing the sound waves of the audio stream and the sound of the audio stream being dampened. Such a sensation may be associated with acoustics that provide a feeling of being relocated from an environment of a particular size to an environment that provides a perception of snow absorbing the sound waves of the audio stream and the sound of the audio stream being dampened.

As an illustrative example, if the vehicle 102 is determined to transition from the comfort mode to the snow mode, one or more audio effects may be provided as a transition effect to provide a transition from providing echoing audio effects that are consistent with the size of the interior cabin environment of the vehicle 102 to an environment that provides a perception of snow absorbing the sound waves of the audio stream and the sound of the audio stream being dampened. The audio effect execution module 306 may thereby operably control the audio system 110 to provide the audio stream through one or more of the audio sources 112 in a manner that gives the listener the feeling of being located within the environment that provides a perception of snow absorbing the sound waves of the audio stream and the sound of the audio stream being dampened It is to be appreciated that the dynamic audio application 106 may provide numerous additional and/or alternative audio effects that may correspond to numerous additional and/or alternative vehicle modes of the vehicle 102. Accordingly, the dynamic audio application 106 utilize mechanical audio effects, echoing audio effects, full range audio effects, midrange audio effects, high-bass audio effects, high-treble audio effects, high midrange audio effects, mid-bass audio effects, nose-canceling audio effects, and the like to provide a sensation of being located in various types and sizes of environments, various venues, and/or may provide various types of sound effects that are based on numerous contemplated vehicle modes of the vehicle 102.

Figure 5:
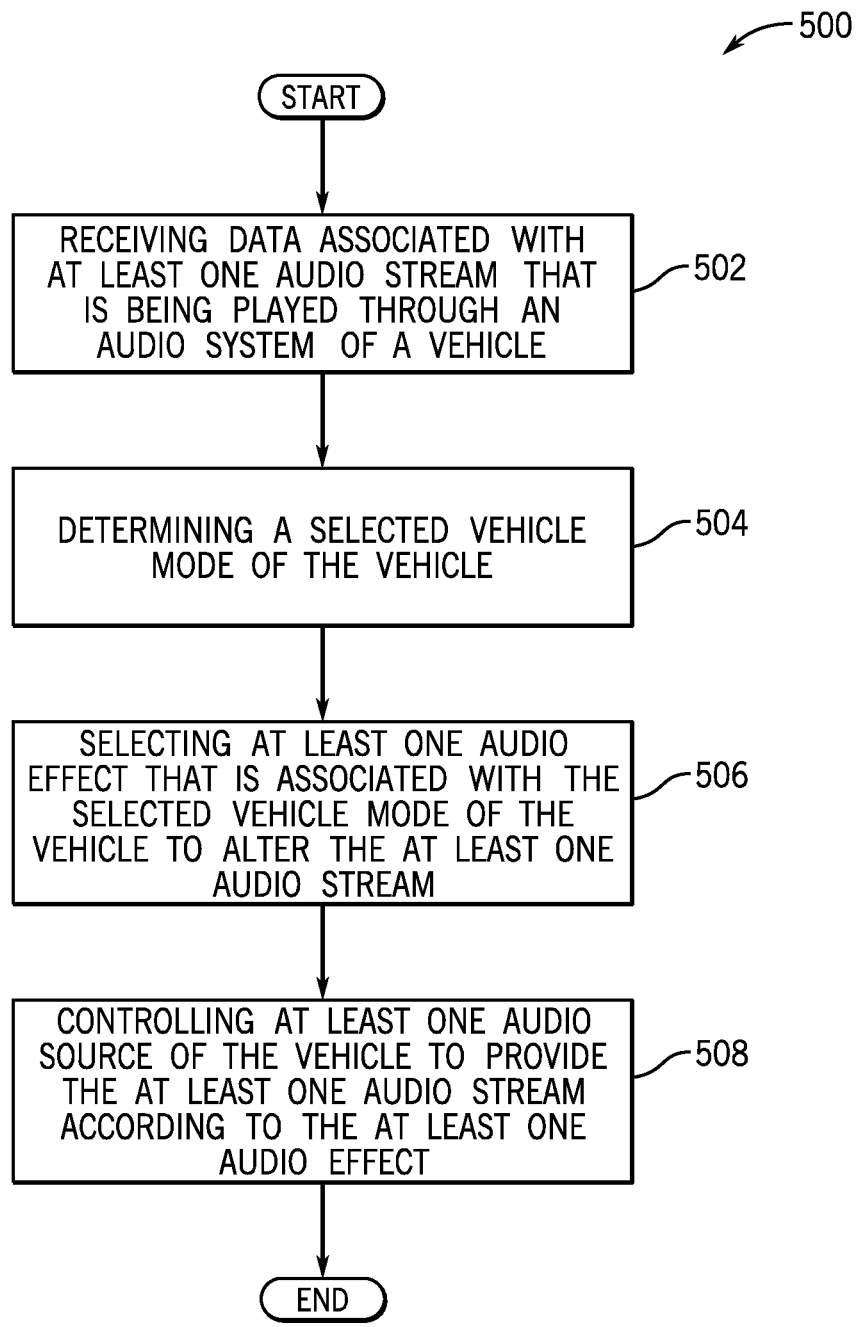
FIG. 5 is a process flow of a method for providing a dynamic audio environment within a vehicle according to an exemplary embodiment of the present disclosure.

FIG. 5 is a process flow of a method 500 for providing a dynamic audio environment within a vehicle 102 according to an exemplary embodiment of the present disclosure. FIG. 5 will be described with reference to the components of FIG. 1, FIG. 2, and FIG. 3 though it is to be appreciated that the method of FIG. 5 may be used with other systems and/or components. The method 500 may begin at block 502, wherein the method 500 may include receiving data associated with at least one audio stream that is being played through an audio system of a vehicle 102.

The method 500 may proceed to block 504, wherein the method 500 may include determining a selected vehicle mode of the vehicle 102. In one embodiment, the selected vehicle mode impacts at least one of: a mechanical operation, an electrical operation, or a dynamic operation of the vehicle 102. The method 500 may proceed to block 506, wherein the method 500 may include selecting at least one audio effect that is associated with the selected vehicle mode of the vehicle 102 to alter the at least one audio stream. The method 500 may proceed to block 508, wherein the method 500 may include controlling at least one audio source 112 of the vehicle 102 to provide the at least one audio stream according to the at least one audio effect.

It should be apparent from the foregoing description that various exemplary embodiments of the disclosure may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein. A machine-readable storage medium may include any mechanism for storing information in a form readable by a machine, such as a personal or laptop computer, a server, or other computing device. Thus, a non-transitory machine-readable storage medium excludes transitory signals but may include both volatile and non-volatile memories, including but not limited to read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

The invention claimed is:

1. A computer-implemented method for providing a dynamic audio environment within a vehicle, comprising:
receiving data associated with at least one audio stream that is being played through an audio system of the vehicle;
determining a selected vehicle mode of the vehicle, wherein the selected vehicle mode impacts at least one of: a mechanical operation, an electrical operation, or a dynamic operation of the vehicle;
selecting at least one audio effect that is associated with the selected vehicle mode of the vehicle to alter the at least one audio stream, wherein selecting the at least one audio effect includes selecting at least one audio effect to replicate an expansive environment that is larger than a size of an interior cabin environment of the vehicle or a small environment that is smaller than the size of the interior cabin environment of the vehicle; and controlling at least one audio source of the vehicle to provide the at least one audio stream according to the at least one audio effect.

2. The computer-implemented method of claim 1, wherein receiving data associated with the at least one audio stream includes communicating with the audio system of the vehicle to receive the data associated with the at least one audio stream being played through the audio system, wherein the data associated with the at least one audio stream is analyzed to determine a format of the at least one audio stream.

3. The computer-implemented method of claim 2, wherein the format of the at least one audio stream includes at least one of: music, speech, and a live event, wherein at least one default audio effect that is associated with the format of the at least one audio stream is determined.

4. The computer-implemented method of claim 3, wherein implementing the at least one audio effect to alter the at least one audio stream includes modifying the at least one default audio effect to at least one audio effect that pertains to the selected vehicle mode of the vehicle to select the at least one audio effect to alter the at least one audio stream.

5. The computer-implemented method of claim 1, wherein controlling the at least one audio source includes controlling at least one speaker that is located at a particular portion of an interior cabin environment of the vehicle to provide the at least one audio effect.

6. A system for providing a dynamic audio environment within a vehicle, comprising:
 a memory storing instructions when executed by a processor cause the processor to:
 receive data associated with at least one audio stream that is being played through an audio system of the vehicle;
 determine a selected vehicle mode of the vehicle, wherein the selected vehicle mode impacts at least one of: a mechanical operation, an electrical operation, or a dynamic operation of the vehicle;
 select at least one audio effect that is associated with the selected vehicle mode of the vehicle to alter the at least one audio stream, wherein selecting the at least one audio effect includes selecting at least one audio effect to replicate an expansive environment that is larger than a size of an interior cabin environment of the vehicle or a small environment that is smaller than the size of the interior cabin environment of the vehicle; and
 control at least one audio source of the vehicle to provide the at least one audio stream according to the at least one audio effect.

7. The system of claim 6, wherein receiving data associated with the at least one audio stream includes communicating with the audio system of the vehicle to receive the data associated with the at least one audio stream being played through the audio system, wherein the data associated with the at least one audio stream is analyzed to determine a format of the at least one audio stream.

8. The system of claim 7, wherein the format of the at least one audio stream includes at least one of: music, speech, and a live event, wherein at least one default audio effect that is associated with the format of the at least one audio stream is determined.

9. The system of claim 8, wherein implementing the at least one audio effect to alter the at least one audio stream includes modifying the at least one default audio effect to at least one audio effect that pertains to the selected vehicle mode of the vehicle to select the at least one audio effect to alter the at least one audio stream.

10. The system of claim 6, wherein controlling the at least one audio source includes controlling at least one speaker that is located at a particular portion of an interior cabin environment of the vehicle to provide the at least one audio effect.

11. A computer-implemented method for providing a dynamic audio environment within a vehicle, comprising:
 receiving data associated with at least one audio stream that is being played through an audio system of the vehicle;
 determining a selected vehicle mode of the vehicle, wherein the selected vehicle mode impacts at least one of: a mechanical operation, an electrical operation, or a dynamic operation of the vehicle;
 selecting at least one audio effect that is associated with the selected vehicle mode of the vehicle to alter the at least one audio stream, wherein the at least one audio effect is selected to replicate snow absorption of sound waves of the at least one audio stream; and
 controlling at least one audio source of the vehicle to provide the at least one audio stream according to the at least one audio effect.

12. The computer-implemented method of claim 11, wherein implementing the at least one audio effect to alter the at least one audio stream includes modifying at least one default audio effect to at least one audio effect that pertains to the selected vehicle mode of the vehicle to select the at least one audio effect to alter the at least one audio stream.

13. The computer-implemented method of claim 11, wherein controlling the at least one audio source includes controlling at least one speaker that is located at a particular portion of an interior cabin environment of the vehicle to provide the at least one audio effect.

* * * * *